(12) United States Patent
Nohra (10) Patent No.: US 9,379,698 B2
(45) Date of Patent: Jun. 28, 2016

(54) FIELD EFFECT TRANSISTOR SWITCHING CIRCUIT

(71) Applicant: TriQuint Semiconductor, Inc., Hillsboro, OR (US)

(72) Inventor: George Nohra, Marlborough, MA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 145 days.

(21) Appl. No.: 14/172,727

(22) Filed: Feb. 4, 2014

(65) Prior Publication Data

US 2015/0222259 A1   Aug. 6, 2015

(51) Int. Cl.
  *H03K 17/30* (2006.01)
  *H03K 17/16* (2006.01)
  *H03K 17/687* (2006.01)

(52) U.S. Cl.
  CPC .......... *H03K 17/162* (2013.01); *H03K 17/6872* (2013.01)

(58) Field of Classification Search
  CPC ............ H01L 2924/00; H01L 29/1608; H01L 29/66068; H01L 29/7813; H02H 9/046
  See application file for complete search history.

(56) References Cited

U.S. PATENT DOCUMENTS

| | | |
|---|---|---|
| 3,551,788 A | 12/1970 | Summer |
| 3,699,359 A | 10/1972 | Shelby |
| 4,053,916 A | 10/1977 | Cricchi et al. |
| 4,316,101 A | 2/1982 | Minner |
| 4,491,750 A | 1/1985 | Janutka |
| 5,012,123 A | 4/1991 | Ayasli et al. |
| 5,146,178 A | 9/1992 | Nojima et al. |
| 5,313,083 A | 5/1994 | Schindler |
| 5,416,043 A | 5/1995 | Burgener et al. |
| 5,492,857 A | 2/1996 | Reedy et al. |
| 5,548,239 A | 8/1996 | Kohama |
| 5,553,295 A | 9/1996 | Pantelakis et al. |
| 5,572,040 A | 11/1996 | Reedy et al. |
| 5,596,205 A | 1/1997 | Reedy et al. |
| 5,600,169 A | 2/1997 | Burgener et al. |
| 5,663,570 A | 9/1997 | Reedy et al. |
| 5,777,530 A | 7/1998 | Nakatuka |
| 5,801,577 A | 9/1998 | Tailliet |
| 5,818,099 A | 10/1998 | Burghartz |

(Continued)

FOREIGN PATENT DOCUMENTS

| | | |
|---|---|---|
| CN | 1256521 | 6/2000 |
| EP | 0385641 | 9/1990 |

(Continued)

OTHER PUBLICATIONS

Non-Final Office Action in U.S. Appl. No. 13/772,277 dated Sep. 24, 2014.

(Continued)

*Primary Examiner* — Sibin Chen
(74) *Attorney, Agent, or Firm* — Withrow & Terranova, P.L.L.C.

(57) ABSTRACT

Embodiments include an apparatus, system, and method related to a switching circuit. In some embodiments, the switching circuit may include first switch including an n-channel field effect transistor (FET) in the signal path. The switching circuit may further include a second switch in shunt to the first switch. The second switch may include a discharge transistor to provide a discharge path for a body of a switch transistor. Other embodiments may be described and claimed.

18 Claims, 4 Drawing Sheets

(56) References Cited

U.S. PATENT DOCUMENTS

| | | |
|---|---|---|
| 5,861,336 A | 1/1999 | Reedy et al. |
| 5,863,823 A | 1/1999 | Burgener |
| 5,883,396 A | 3/1999 | Reedy et al. |
| 5,895,957 A | 4/1999 | Reedy et al. |
| 5,920,233 A | 7/1999 | Denny |
| 5,930,638 A | 7/1999 | Reedy et al. |
| 5,945,867 A | 8/1999 | Uda et al. |
| 5,973,363 A | 10/1999 | Staab et al. |
| 5,973,382 A | 10/1999 | Burgener et al. |
| 6,057,555 A | 5/2000 | Reedy et al. |
| 6,066,993 A | 5/2000 | Yamamoto et al. |
| 6,100,159 A | 8/2000 | Krivokapic |
| 6,111,455 A | 8/2000 | Eleyan et al. |
| 6,160,292 A | 12/2000 | Flaker et al. |
| 6,173,235 B1 | 1/2001 | Maeda |
| 6,225,667 B1 | 5/2001 | Buynoski et al. |
| 6,229,187 B1 | 5/2001 | Ju |
| 6,249,027 B1 | 6/2001 | Burr |
| 6,288,613 B1 | 9/2001 | Bennett |
| 6,308,047 B1 | 10/2001 | Yamamoto et al. |
| 6,376,286 B1 | 4/2002 | Ju |
| 6,417,030 B1 | 7/2002 | Buynoski et al. |
| 6,452,232 B1 | 9/2002 | Adan |
| 6,503,783 B1 | 1/2003 | Mouli |
| 6,504,212 B1 | 1/2003 | Allen et al. |
| 6,563,366 B1 | 5/2003 | Kohama |
| 6,631,505 B2 | 10/2003 | Arai |
| 6,632,724 B2 | 10/2003 | Henley et al. |
| 6,635,928 B2 | 10/2003 | Mouli |
| RE38,319 E | 11/2003 | Lin et al. |
| 6,642,578 B1 | 11/2003 | Arnold et al. |
| 6,693,326 B2 | 2/2004 | Adan |
| 6,716,682 B1 | 4/2004 | Mouli |
| 6,785,703 B2 | 8/2004 | Bradley et al. |
| 6,790,747 B2 | 9/2004 | Henley et al. |
| 6,804,502 B2 | 10/2004 | Burgener et al. |
| 6,898,778 B2 | 5/2005 | Kawanaka |
| 6,905,918 B2 | 6/2005 | Mouli |
| 6,908,832 B2 | 6/2005 | Farrens et al. |
| 6,924,673 B2 | 8/2005 | Tanishima |
| 6,930,357 B2 | 8/2005 | Kang |
| 6,958,519 B2 | 10/2005 | Gonzalez et al. |
| 6,969,668 B1 | 11/2005 | Kang et al. |
| 6,978,437 B1 | 12/2005 | Rittman et al. |
| 6,989,706 B2 | 1/2006 | Sekigawa et al. |
| 7,056,808 B2 | 6/2006 | Henley et al. |
| 7,057,472 B2 | 6/2006 | Fukamachi et al. |
| 7,058,922 B2 | 6/2006 | Kawanaka |
| 7,122,411 B2 | 10/2006 | Mouli |
| 7,123,898 B2 | 10/2006 | Burgener et al. |
| 7,138,846 B2 | 11/2006 | Suwa |
| 7,158,067 B2 | 1/2007 | Lauritzen et al. |
| 7,244,991 B2 | 7/2007 | Ohsawa |
| 7,404,157 B2 | 7/2008 | Tanabe |
| 7,460,852 B2 | 12/2008 | Burgener et al. |
| 7,566,600 B2 | 7/2009 | Mouli |
| 7,616,482 B2 | 11/2009 | Prall |
| 7,796,969 B2 | 9/2010 | Kelly et al. |
| 7,860,499 B2 | 12/2010 | Burgener et al. |
| 7,863,691 B2 | 1/2011 | Wagner, Jr. et al. |
| 7,890,891 B2 | 2/2011 | Stuber et al. |
| 7,910,993 B2 | 3/2011 | Brindle et al. |
| 8,129,787 B2 | 3/2012 | Brindle et al. |
| 8,159,283 B2 | 4/2012 | Sugiyama |
| 8,385,845 B1 | 2/2013 | Cortese |
| 8,395,435 B2 | 3/2013 | Cassia et al. |
| 8,723,260 B1 | 5/2014 | Carroll et al. |
| 8,729,952 B2 | 5/2014 | Yang et al. |
| 8,847,672 B2 | 9/2014 | Prabhakar, III et al. |
| 8,886,136 B1 | 11/2014 | Signoff et al. |
| 8,977,217 B1 | 3/2015 | Connick et al. |
| 2001/0015461 A1 | 8/2001 | Ebina |
| 2001/0045602 A1 | 11/2001 | Maeda et al. |
| 2002/0195623 A1 | 12/2002 | Horiuchi |
| 2003/0002452 A1 | 1/2003 | Sahota |
| 2003/0205760 A1 | 11/2003 | Kawanaka et al. |
| 2004/0080364 A1 | 4/2004 | Sander et al. |
| 2005/0167751 A1 | 8/2005 | Nakajima et al. |
| 2006/0022733 A1 | 2/2006 | Nair |
| 2006/0044043 A1 | 3/2006 | Marshall |
| 2007/0023833 A1 | 2/2007 | Okhonin et al. |
| 2007/0138549 A1* | 6/2007 | Wu ................. H01L 29/4238 257/341 |
| 2008/0073719 A1 | 3/2008 | Fazan et al. |
| 2008/0076371 A1 | 3/2008 | Dribinsky et al. |
| 2008/0303080 A1 | 12/2008 | Bhattacharyya |
| 2009/0029511 A1 | 1/2009 | Wu |
| 2010/0013016 A1* | 1/2010 | Shih ................. H01L 27/0259 257/360 |
| 2011/0090022 A1 | 4/2011 | Villain |
| 2011/0227637 A1 | 9/2011 | Stuber et al. |
| 2011/0260774 A1 | 10/2011 | Granger-Jones et al. |
| 2011/0285481 A1 | 11/2011 | Huang et al. |
| 2012/0154963 A1* | 6/2012 | Deval ................. H02H 9/046 361/56 |
| 2012/0169398 A1 | 7/2012 | Brindle et al. |
| 2012/0267719 A1 | 10/2012 | Brindle et al. |
| 2013/0029614 A1 | 1/2013 | Cho |
| 2013/0100561 A1* | 4/2013 | Senouci ............. H02H 9/046 361/56 |
| 2013/0252562 A1 | 9/2013 | Hasson et al. |
| 2013/0285674 A1* | 10/2013 | Chiang ............. G01R 31/40 324/609 |
| 2014/0002171 A1 | 1/2014 | Nohra |
| 2014/0009214 A1 | 1/2014 | Altunkilic |
| 2014/0227983 A1 | 8/2014 | Clausen |

FOREIGN PATENT DOCUMENTS

| | | |
|---|---|---|
| EP | 1006584 | 6/2000 |
| EP | 1451890 | 2/2011 |
| JP | 5575348 | 6/1980 |
| JP | 01254014 | 10/1989 |
| JP | 02161769 | 6/1990 |
| JP | 04183008 | 6/1992 |
| JP | 06334506 | 12/1994 |
| JP | 08148949 | 6/1996 |
| JP | 08307305 | 11/1996 |
| JP | 09284114 | 10/1997 |
| JP | 10242829 | 9/1998 |
| JP | 11136111 | 5/1999 |
| JP | 2003060451 | 2/2003 |
| JP | 3408762 | 5/2003 |
| JP | 2003189248 | 7/2003 |
| JP | 2004515937 | 5/2004 |
| WO | WO 9523460 | 8/1995 |
| WO | WO 0227920 | 4/2002 |
| WO | WO 2007008934 | 1/2007 |
| WO | WO 2007035610 | 3/2007 |

OTHER PUBLICATIONS

Notice of Allowance and Examiner-Initiated Interview Summary for U.S. Appl. No. 13/742,086, mailed Jun. 24, 2014, 10 pages.

Non-Final Office Action in U.S. Appl. No. 13/764,655 dated Dec. 4, 2014.

Non-Final Office Action in U.S. Appl. No. 13/774,928 dated Jan. 6, 2015.

Assaderaghi, et al.; "Dynamic Threshold-Voltage MOSFET (DTMOS) for Ultra-Low Voltage VLSI;" IEEE. vol. 44; No. 3; 414-421; Mar. 1997.

Bolam, R. et al., "Reliability Issues for Silicon-on-Insulator," Electron Devices Meeting Technical Digest, 2000, pp. 131-134.

Burgener, et al.; "CMOS SOS Switches Offer Useful Features, High Integration;" Microwaves & RF; 107-118; Aug. 2001.

Caverly, R. et al., "A Silicon CMOS Monolithic RF and Microwave Switching Element," 27th European Microwave Conference, Sep. 1997, pp. 1046-1051.

Caverly; "Linear and Nonlinear Characteristics of the Silicon CMOS Monolithic 50-Ω Microwave and RF Control Element;" IEEE. vol. 34; No. 1; 124-126; Jan. 1999.

(56) References Cited

OTHER PUBLICATIONS

Celler, et al.; "Smart Cut—A guide to the technology, the process, the products;" http://www.soitec.com/pdf/SmartCut_WP.pdf; Jul. 2003.
Chao, et al.; "High-Voltage and High-Temperature Applications of DTMOS with Reverse Schottky Barrier on Substrate Conctacts;" IEEE Electron Device Letters; vol. 25; No. 2; Feb. 2004; pp. 86-88.
Chung, I. et al., "SOI MOSFET Structure with a Junction-Type Body Contact for Suppression of Pass Gate Leakage," IEEE Transactions on Electron Devices, Jul. 2001, pp. 1360-1365, vol. 48, No. 7.
Dean; "Transistors, Theory and Circuitry." McGraw-Hill Publ. Co. Ltdl; 90-93; 1964.
Drake, et al.; "Dynamic-Threshold Logic for Low-Power VLSI Design." http://www.research.ibm.com/acas/projects/01drake.pdf; 2003.
Edwards, et al.; "The Effect of Body Contact Series Resistance on SOI CMOS Amplifier Stages;" IEEE Transactions on Electron Devices; vol. 44; No. 12; Dec. 1997; pp. 2290-2294.
Hameau, F. et al., "Radio-Frequency Circuits Integration Using CMOS SOI 0.25μm Technology," 2002 RF IC Design Workshop Europe, Mar. 19-22, 2002, 6 pages.
Hess et al.; "Transformerless Capacitive Coupling of Gate Signals for Series Operation of Power MOS Devices;" IEEE; vol. 15; No. 5; Sep. 2000.
Hirano, Y. et al., "Impact of Actively Body-bias Controlled (ABC) SOI SRAM by using Direct Body Contact Technology for Low-Voltage Application," Electron Devices Meeting Technical Digest, 2003, pp. 2.4.1-2.4.4.
Hu, C. et al., "A Unified Gate Oxide Reliability Model," IEEE 37th Annual International Reliability Physics Symposium, 1999, pp. 47-51.
Huang et al.; "A 0.5-μm CMOS T/R Switch for 900-MHz Wireless Applications;" IEEE Journal of Solid-State Circuits; vol. 36; No. 3; Mar. 2001.
Iyama, et al.; "L-Band SPDT Switch Using Si-MOSFET;" The Institute of Electronics, Information and Communication Engineers (IEICE); 636-643; 1996.
Johnson, et al.; "Advanced Thin-Film Silicon-on-Sapphire Technology: Microwave Circuit Applications;" IEEE; vol. 45; No. 5; May 1998.
Kuang, J. et al., "A floating-body charge monitoring technique for partially depleted SOI technology," Int. J. Electronics, Nov. 2004, pp. 625-637, vol. 91, No. 11.
Kuang, J. et al., "SRAM Bitline Circuits on PD SOI: Advantages and Concerns," IEEE Journal of Solid-State Circuits, Jun. 1997, pp. 837-844, vol. 32, No. 6.
Kuo, et al.; "Low-Voltage SOI CMOS VLSI Devices and Circuits;" Wiley Interscience, New York, XP001090589, pp. 57-60 and pp. 349-354; 2001.
Lauterbach, et al.; "Charge Sharing Concept and New Clocking Scheme for Power Efficiency and Electromagnetic Emission Improvement of Boosted Charge Pumps;" IEEE Journal of Solid-State Circuits; vol. 35; No. 5; pp. 719-723; May 2000.
Lee et al., "Effects of Gate Structures on the RF Performance in PD SOI MOSFETs," IEEE Microwave and Wireless Components Letters, Apr. 2005, pp. 223-225, vol. 15, No. 4.
Lee, et al.; "Effect of Body Structure on Analog Performance of SOI NMOSFETs;" Proceedings; 1998 IEEE International SOI Conference; Oct. 5-8, 1998; pp. 61-62.
Lee, H. et al., "Analysis of body bias effect with PD-SOI for analog and RF applications," Solid State Electronics, 2002, pp. 1169-1176, vol. 46.
Lee, H. et al., "Harmonic Distortion due to Narrow Width Effects in Deep sub-micron SOI-CMOS Device for analog-RF applications," 2002 IEEE International SOI Conference, Oct. 2002, pp. 83-85.
Li, et al.; "A 15-GHz Integrated CMOS Switch with 21.5-dBm IP1dB and 1.8-dB Insertion Loss;" IEEE; 2004 Symposium on VLSI Circuits; Digest of Technical Papers; Jun. 17-19, 2004.
Maeda, et al.; "Substrate-Bias Effect and Source-Drain Breakdown Characteristics in Body-Tied Short-Channel SOI MOSFET's;" IEEE Transactions on Electron Devices; vol. 46; No. 1; Jan. 1999; pp. 151-158.
Makioka, S. et al., "Super Self-Aligned GaAs RF Switch IC with 0.25 dB Extremely Low Insertion Loss for Mobile Communication Systems," IEEE Transactions on Electron Devices, Aug. 2001, pp. 1510-1514, vol. 48, No. 8.
Megahed, M. et al, "Low Cost UTSI Technology for RF Wireless Applications," IEEE MTT-S Digest, 1998, pp. 981-984.
Orndorff, et al.; "CMOS/SOS/LSI Switching Regulator Control Device;" Solid-State Circuits Conf.; Digest of Technical Papers; IEEE International; vol. XXI; pp. 234-235; Feb. 1978.
Phillips Semiconductors; "Single Pole Double Throw (SPDT) Switch, RF Communication Products;" IC17 Handbook; 1997.
Rodgers, P. et al., "Silicon UTSi CMOS RFIC for CDMA Wireless Communications Systems," IEEE MTT-S Digest, 1999, pp. 485-488.
Rozeau, O. et al., "SOI Technologies for Low-Power Low-Voltage Radio-Frequency Applications," Analog Integrated Circuits and Signal Processing, 2000, pp. 93-114, vol. 25.
Sedra, A. et al., Microelectronic Circuits, 1998, Fourth Edition, University of Toronto Press, Oxford University Press, pp. 374-375.
Sleight, J. et al., "Transient Measurements of SOI Body Contact Effectiveness," IEEE Electron Device Letters, Dec. 1998, pp. 499-501, vol. 19, No. 12.
Suehle et al., "Low Electric Field Breakdown of Thin SiO2 Films Under Static and Dynamic Stress," IEEE Transactions on Electron Devices, May 1997, pp. 801-808, vol. 44, No. 5.
Tinella, et al.; "A High-Performance CMOS-SOI Antenna Switch for the 2.5 5-GHz Band;" IEEE Journal of Solid-State Circuits; vol. 38; No. 7; Jul. 2003.
Wei, et al.; "Measurement of Transient Effects in SOI DRAM/SRAM Access Transistors;" IEEE Electron Device Letters; vol. 17; No. 5; May 1996.
Workman, et al.; "A Comparative Analysis of the Dynamic Behavior of BTG/SOI MOSFET's and Circuits with Distributed Body Resistance;" IEEE Transactions on Electron Devices; vol. 45; No. 10; Oct. 1998; pp. 2138-2145.
Yamamoto, et al.; A 2.2-V Operation, 2.4-GHz Single-Chip GaAs MMIC Transceiver for Wireless Applications; IEEE; vol. 34; No. 4; Apr. 1999.
Non-Final Office Action in U.S. Appl. No. 13/587,590, dated Sep. 9, 2013.
Non-Final Office Action in U.S. Appl. No. 13/742,086, dated Sep. 20, 2013.
Notice of Allowance in U.S. Appl. No. 13/587,590 dated Jan. 7, 2014.
Final Office Action in U.S. Appl. No. 13/742,086, dated Mar. 4, 2014.
Non-Final Office Action for U.S. Appl. No. 13/764,655, mailed Dec. 4, 2014, 14 pages.
Notice of Allowance for U.S. Appl. No. 13/764,655, mailed May 8, 2015, 6 pages.
Non-Final Office Action for U.S. Appl. No. 13/774,928, mailed Jan. 5, 2015, 6 pages.
Notice of Allowance for U.S. Appl. No. 13/774,928, mailed Apr. 24, 2015, 7 pages.
Notice of Allowance for U.S. Appl. No. 13/774,928, mailed Jul. 31, 2015, 7 pages.
Notice before Examination for Israeli Patent Application No. 230314, mailed Oct. 25, 2015, 6 pages.
Notice before Examination for Israeli Patent Application No. 230677, mailed Nov. 9, 2015, 6 pages.

* cited by examiner

FIELD EFFECT TRANSISTOR SWITCHING CIRCUIT

FIELD

Embodiments of the present disclosure relate generally to the field of circuits, and more particularly to switching circuits.

BACKGROUND

Field effect transistors (FETs) may be used for low-power radio frequency (RF) switch devices, especially in mobile applications where price, performance, and power consumption are key elements. However, FETs may be challenged when handling larger signals. In particular, large signal performance in FETs acting as switches may be affected by charge accumulation in a quasi-neutral region of the body of the FETs. Charge accumulation may result in hot-carrier accumulation, excess gate-induced drain leakage (GIDL), negative transconductance, loss of gate control, hysteresis, etc. These issues may be generally referred to as floating body effect (FBE).

In some applications, certain applications may require ultra-fast, and ultra-low loss/high isolation switches. In some cases a low loss switch may require a negative voltage generator (NVG) which may be used to achieve the required low loss and isolation, and also to meet the large signal requirement. However, using an NVG may result in a slower switch, as well as significant overhead in terms of the circuit area. Additionally, the use of the NVG may result in leakage current in sleep mode, that is when the circuit is not actively transferring signal. In some cases, blocking capacitors may be used in the switches to combat the above described issues, however the use of blocking capacitors may result in a high circuit area and also decrease circuit performance. For example, the circuit may experience bad insertion loss, bad linearity, and/or bad isolation.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Embodiments include a switching circuit. In some embodiments, the switching circuit may include a first switch that includes an n-channel switch transistor in the signal path. The n-channel switch transistor may be an n-channel field effect transistor (FET). The switching circuit may further include a second switch in shunt to the first switch. The second switch may include a switch transistor and a discharge transistor to provide a discharge path for a body of the switch transistor. The switch transistor and the discharge transistor may be p-channel transistors, and more specifically, p-channel FETs. Both the n-channel transistor and the p-channel transistors may be coupled with a voltage source configured to provide a positive voltage to the switches. When the voltage source provides the positive voltage, the switch that includes the n-channel switch transistor may turn on such that the switch may allow a radio frequency (RF) signal to propagate through the switch. At the same time, the switch that includes the p-channel transistors may turn off due to the positive voltage. The positive voltage may then be removed, or a negative voltage may be applied, and the switch that includes the n-channel transistor may turn off while the switch that includes the p-channel transistors turns on. Other embodiments may be described and claimed.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
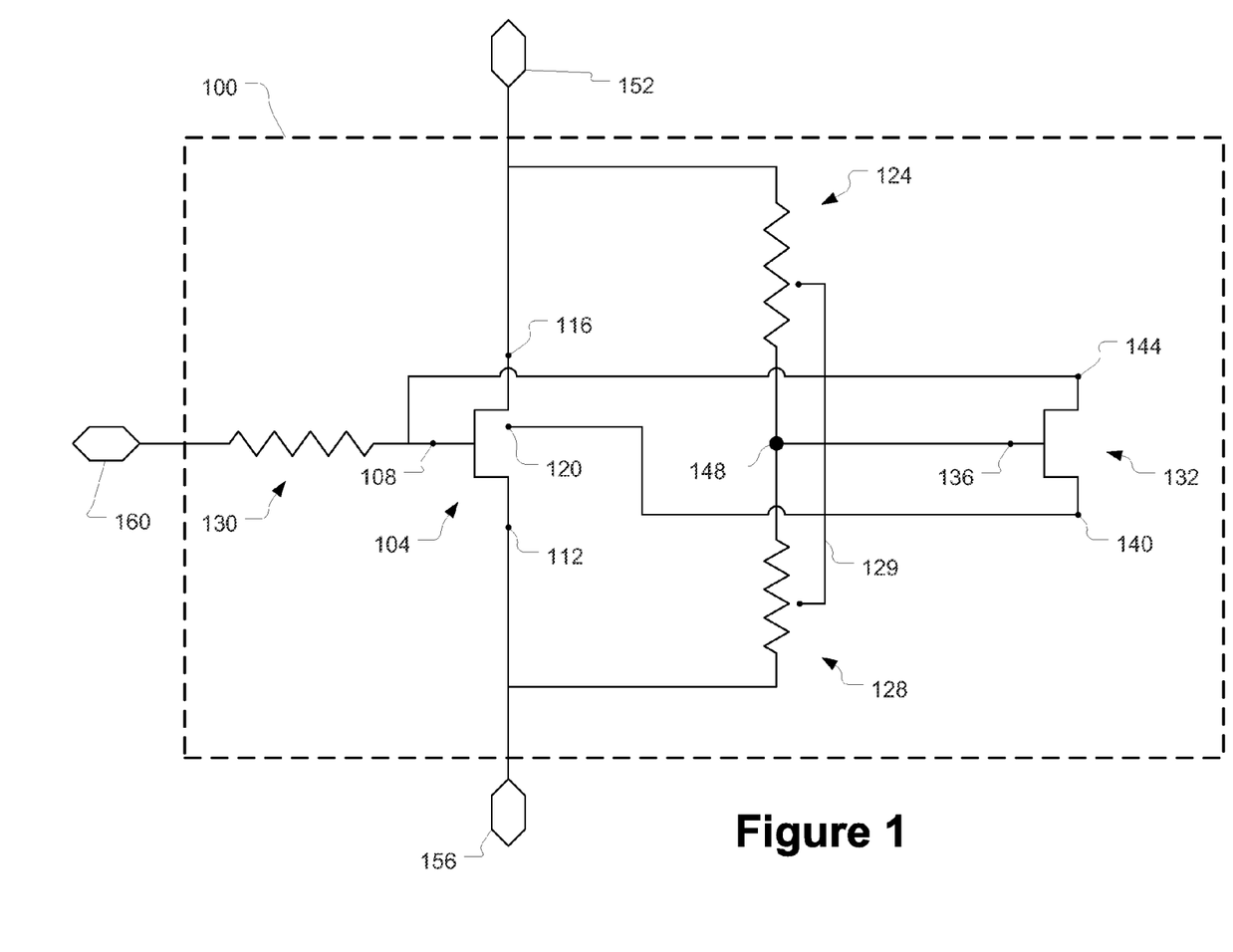
FIG. 1 illustrates a field effect transistor (FET) switch, in accordance with various embodiments.

FIG. 1 illustrates a switch 100 in accordance with various embodiments. Switch 100 may be a silicon on insulator (SOI) device having a silicon layer disposed on an insulating layer, which may also be referred to as a buried oxide (BOX) layer. In some embodiments an additional silicon layer may be disposed under the insulating layer.

In various embodiments, the top silicon layer may be approximately 50 to 90 nanometers (nm) thick and the insulating layer, which may be a silicon dioxide or sapphire layer, may be approximately 100 to 200 nm thick. In some embodiments, the switch 100 may be a partially-depleted SOI (PD-SOI) device in which the silicon under a doped channel is partially depleted of mobile charge carriers. The partially depleted area may be referred to as a quasi-neutral region.

Switch 100 may include a switch transistor 104. In some embodiments, the switch transistor 104 may be a field effect transistor (FET). In some embodiments, the switch transistor 104 may have a tendency to accumulate charges in the quasi-neutral region, as described above. Embodiments described herein provide for the discharge of these accumulated charges while mitigating at least some of the above-identified issues related to other techniques devised to address the FBE issues.

The switch transistor 104 may include a gate contact 108, a source contact 112, a drain contact 116, and a body contact 120. The switch 100 may further include resistors 124 and 128 coupled in series with one another and further coupled with and between the source contact 112 and the drain contact 116 as shown. The resistors 124 and 128 may be of equal size in some embodiments. In some embodiments, the resistors 124 and 128 may be high-density resistors. In some embodiments, the resistors 124 and 128 may be coupled by a control line 129. The switch 100 may further include resistor 130 coupled with gate contact 108.

The switch 100 may further include a discharge transistor 132. In some embodiments, the discharge transistor 132 may be a FET. The discharge transistor 132 may work to create a discharge path to discharge charges that accumulate in the quasi-neutral region of the switch transistor 104. The discharge transistor 132 may include a gate contact 136, a source contact 140, and a drain contact 144. The gate contact 136 may be coupled with a node 148 that is located between resistors 124 and 128; the source contact 140 may be coupled with the body contact 120; and the drain contact 144 may be coupled with the gate contact 108.

The resistors 124 and 128 may provide a virtual ground, e.g., a fixed potential, at the node 148 and, therefore, the gate contact 136. Using the discharge transistor 132 to tie the body contact 120, the drain contact 116, and the source contact 112 to the fixed potential of the node 148 may facilitate removal of the potential difference between the gate contact 108 and the body contact 120 and, therefore, discharging charges from the quasi-neutral region.

In some embodiments, the drain contact 116 may be coupled either directly or indirectly with a radio frequency (RF) signal input terminal 152 through which the switch 100 may receive an RF signal. The source contact 112 may be coupled either directly or indirectly with an RF signal output terminal 156 from which the RF signal may be output by the switch 100. The gate contact 108 and/or the drain contact 144 may be coupled either directly or indirectly with a voltage source 160, which may supply a control voltage to turn the switch transistor 104 and the discharge transistor 132 on or off, as described below.

In embodiments, the switch 100 may operate as follows. It will be noted that the below description assumes that the switch transistor 104 and the discharge transistor 132 are both n-channel FETs. However, as described in further detail below, in some embodiments the switch transistor 104 and the discharge transistor 132 may both be p-channel FETs in which case the operation may be reversed.

Initially, the switch 100 may be turned on by turning on the switch transistor 104 to pass a signal, e.g., the radio frequency (RF) signal received from the RF signal input terminal 152, from the drain contact 116 to the source contact 112. In some embodiments, the switch transistor 104 may be turned on by application of a positive DC voltage, e.g., 2.5 volts (V), to the gate contact 108 of the switch transistor 132, for example by application of the positive DC voltage from the voltage source 160. The drain contact 144 of the discharge transistor 132 will also see the positive DC voltage. The gate contact 136 of the discharge transistor 132 may see a 0 voltage at the virtual ground. This may result in a gate-source voltage, $V\_gs$, of $-2.5$ V at the discharge transistor 132. This will turn off the discharge transistor 132 and, in effect, remove the discharge transistor 132 from the switch circuit.

In some embodiments, the switch 100 may be turned off to provide a discharge path between the gate contact 108 and the body contact 120 of the switch transistor 104. In some embodiments, the switch 100 may be turned off by turning off the switch transistor 104 to prevent passage of a signal, e.g., the RF signal received from the RF signal input terminal 152, from the drain contact 116 to the source contact 112. In some embodiments, the switch transistor 104 may be turned off by application of no DC voltage or a negative DC voltage, e.g., 0 V or $-2.5$ V, to the gate contact 108 of the switch transistor 104. The drain contact 144 of the discharge transistor 132 may also see the negative DC voltage. This may result in a positive $V\_gs$, e.g. 2.5 V, at the discharge transistor 132. This may turn on the discharge transistor 132 thereby creating a discharge path by coupling the gate contact 108 of the switch transistor 104 to the body contact 120 of the switch transistor 104. This may be done without having to provide voltage headroom as there will be no Vth drop.

While operation of the switch 100 is generally discussed in terms of using an n-channel FET as the switch transistor 104 (also referred to as "NMOS switch" or an "NMOS transistor"), embodiments using a p-channel transistor such as a p-channel FET as the switch transistor 104 (also referred to as "PMOS switch" or a "PMOS transistor") and the discharge transistor 132 may be used. In embodiments where the switch transistor 104 and the discharge transistor 132 are p-channel transistors, application of a positive voltage may cause the p-channel transistors to turn off while application of a negative voltage or no voltage may cause the n-channel transistors to turn on.

Providing a discharge path using the switch 100 as described above may not incur the same penalty related to voltage threshold headroom that is associated with a diode-connected FET switch circuit. Example simulations have shown that, with respect to a diode-connected FET switch circuit, the switch 100 may be associated with a 3 dB improvement with respect to IMD, a 2.5 dB improvement with respect to third-order harmonics, and a 1.5 dB improvement with respect to second-order harmonics.

Providing a discharge path using the switch 100 as described above also may not incur the same penalty related to insertion loss that is associated with a resistive body contact (BC) switch circuit. Example simulations have shown that, with respect to a resistive BC switch circuit, the switch 100 may be associated with 40 millidecibles (mdB) or greater improvement with respect to insertion loss, 1 dB improvement with respect to IMD, a 3.5 dB improvement with respect to second-order harmonics, and a 0.5 dB improvement with respect to third-order harmonics.

The switch 100 may be a common-gate amplifier and may be incorporated into a large number of applications including, but not limited to, complementary metal oxide semiconductor (CMOS) switches, power amplifiers, low-noise amplifiers (LNAs), buffers, duplexers, etc.

Figure 2:
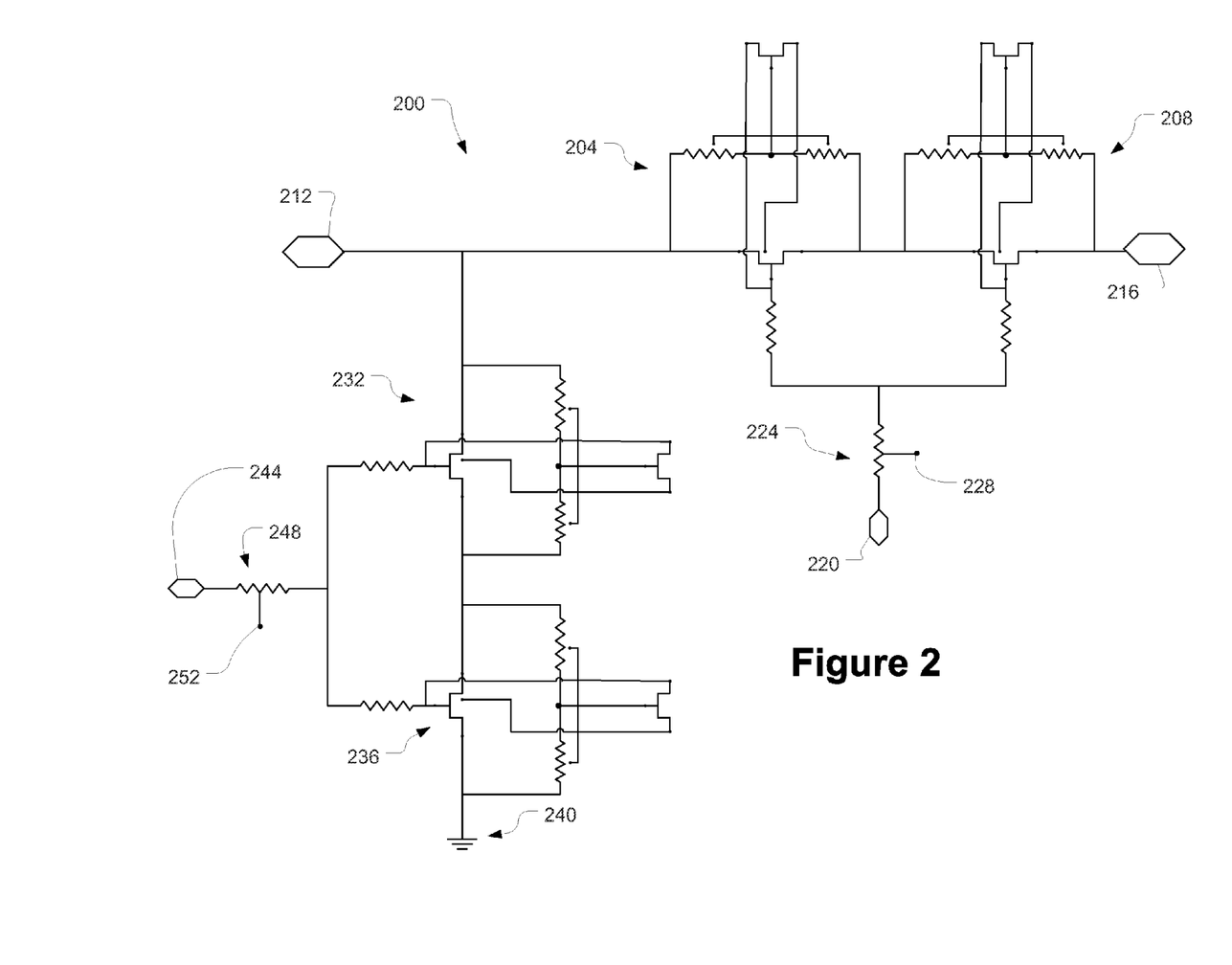
FIG. 2 illustrates a switching circuit incorporating a plurality of switches, in accordance with various embodiments.

In some embodiments, a plurality of switches 100 may be incorporated into a single circuit design. FIG. 2 depicts an example of a switching circuit 200 incorporating one or more switches, which may each be similar to the switch 100 described above. Specifically, the switching circuit 200 may include switches 204 and 208. Switches 204 and 208 may be coupled with, and generally positioned between, an RF signal input 212 and an RF signal output 216, which may be respectively similar to RF signal input 152 and RF signal output 156. Switches 204 and 208 may be respectively similar to the switch 100 described above, and both the switch transistors and discharge transistors of switches 204 and 208 may be n-channel transistors, and more specifically n-channel FETs, as discussed above. As shown in FIG. 2, switches 204 and 208 may be coupled with one another in series such that the source contact of the switch transistor of switch 204 is coupled with the drain contact of the switch transistor of switch 208.

In embodiments, switches 204 and 208 may be coupled with a voltage source 220 configured to provide a positive voltage, for example 2.5 V. In some embodiments a resistor 224 may be positioned generally between the voltage source 220 and switches 204 and 208. In some embodiments, the resistor 224 may include a control line 228. In embodiments, voltage source 220 may be similar to voltage source 160, described above.

The switching circuit 200 may include additional switches 232 and 236. Switches 232 and 236 may be generally positioned between the RF signal input 212 and ground 240. Specifically, switches 232 and 236 may be said to be in shunt of the switching circuit 200. In embodiments, switches 232 and 236 may be coupled with a voltage source 244 configured to provide a positive voltage, for example 2.5 V. In some embodiments voltage source 244 and voltage source 220 may be the same voltage source, or be otherwise coupled with one another. In some embodiments a resistor 248 may be positioned generally between the voltage source 244 and switches 232 and 236. In some embodiments, the resistor 248 may include a control line 252.

Switches 232 and 236 may be respectively similar to the switch 100 described above, and both the switch transistors and discharge transistors of switches 232 and 236 may be p-channel transistors and, more specifically, p-channel FETs, as discussed above. As shown in FIG. 2, switches 232 and 236 may be coupled with one another in series such that the source contact of the switch transistor of switch 232 is coupled with the drain contact of the switch transistor of switch 236.

Although the switching circuit 200 is described with two switches 204 and 208 with n-channel transistors, and two switches 232 and 236 with p-channel transistors, in other embodiments the switching circuit may have more or less switches. In some embodiments switches 204 and 208 may have p-channel transistors and switches 232 and 236 may have n-channel transistors, and the voltage sources 220 and 224 may be configured to supply a negative voltage.

In operation, switching circuit 200 may operate as follows. An RF signal may be supplied at RF signal input 212. A positive voltage may be supplied at voltage sources 220 and 244. As described above, switches 204 and 208 may involve n-channel FETs. When the switches 204 and 208 receive the positive voltage from voltage source 220, the discharge transistors of each of the switches 204 and 208 may turn off. Additionally, the switch transistors may turn on such that the RF signal can propagate through the switching circuit 200 from RF signal input 212 to RF signal output 216.

Similarly, switches 232 and 236 may receive a positive voltage from voltage source 244. As described above, switches 232 and 236 may involve p-channel FETs. Therefore, the positive voltage received from voltage source 244 may cause the switch transistors of switches 232 and 236 to turn off. When the switch transistors of switches 232 and 236 are turned off, a signal may not be able to propagate from the RF signal input 212 to ground 240. Therefore, the shunt portion of switching circuit 200 may be effectively closed by the application of a positive voltage, while this signal portion of the switching circuit 200 may be opened by the positive voltage.

By contrast, application of no voltage, or a ground voltage, from voltage sources 244 and 220 may cause the switching circuit 200 to operate in a manner opposite to the manner described above. Specifically, application of the ground voltage from voltage source 220 may cause the discharge transistors of switches 204 and 208 to be turned on such that signals can flow to ground 240. For example, noise from the RF signal input 212 may be shunted to ground 240. At the same time, the switch transistors of switches 204 and 208 may be turned off so that the noise from RF signal input 212 may not propagate to the RF signal output 216.

The above described switching circuit 200 may enjoy several advantages. Specifically, the switching circuit 200 may have enhanced insertion loss, and increased isolation and overall performance, while still residing in a relatively compact area. For example, in some embodiments a switch transistor of a switch may have a thickness of approximately 1 millimeter (mm). A discharge transistor of a switch may have a thickness of approximately 1 micron (μm). Additionally, the switching speed of the switching circuit 200 may be considered to be very fast. Additionally, the switching circuit 200 may be implemented using only positive voltage sources such as voltage sources 220 and 244, which in some embodiments may be combined into a single positive voltage source. Therefore, the switching circuit 200 may not require blocking capacitors or a negative voltage generator.

Figure 3:
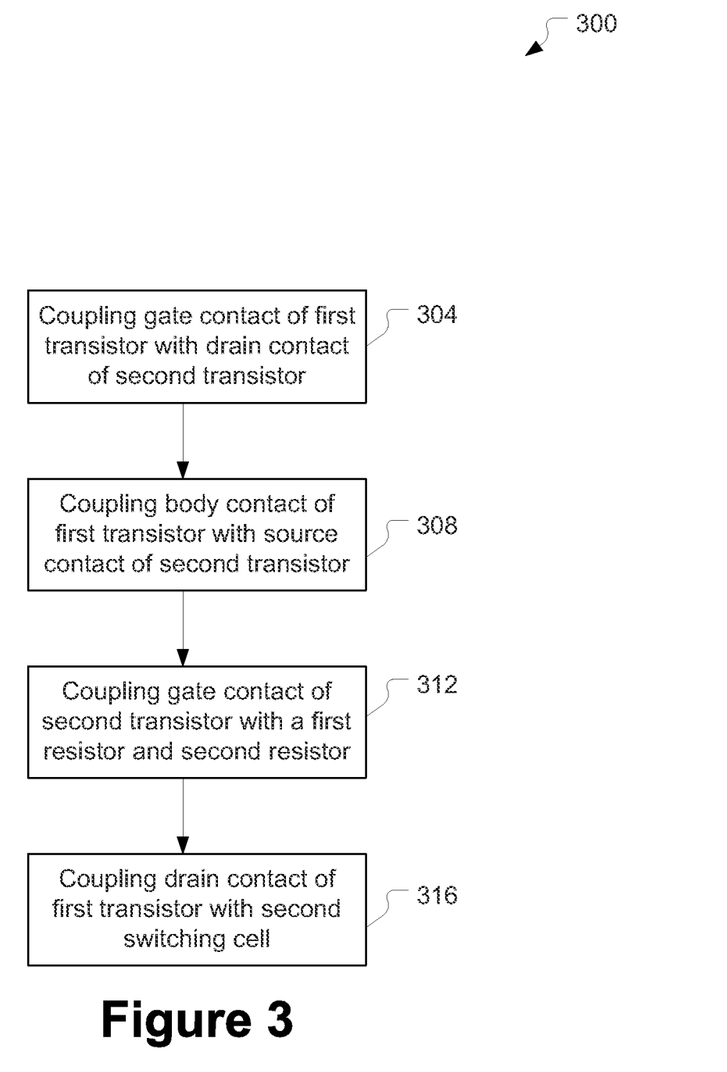
FIG. 3 illustrates an exemplary process of constructing a switching circuit, in accordance with various embodiments.

FIG. 3 depicts an example process for constructing a switching circuit such as switching circuit 200. Initially, the gate contact of a first transistor may be coupled with the drain contact of a second transistor at 304. Specifically, the gate contact of a switch transistor such as switch transistor 104 of a switch 100 in a switch such as switch 232 may be coupled with the drain contact of a discharge transistor such as discharge transistor 132 in switch 232.

Next, a body contact of the first transistor may be coupled with a source contact of the second transistor at 308. Specifically, the body contact of the switch transistor 104 of a switch 100 in the switch 232 may be coupled with the source contact of the discharge transistor 132 in switch 232.

Next, the gate contact of the second transistor may be coupled with a first resistor and a second resistor at 312. Specifically, the gate contact of the discharge transistor 132 in switch 232 may be coupled with resistors such as resistors 124 and 128 such that the gate contact 136 experiences a virtual ground.

Finally, the drain contact of the first transistor may be coupled with a second switch. For example, the drain contact of the switch transistor 104 of a switch 100 in the switch 232 may be coupled with another switch such as switch 204. Specifically, the drain contact of the switching transistor 104 in switch 232 may be coupled with the drain contact of the switching transistor in switch 204. As noted above, the discharge transistor and switching transistor of switch 232 may be p-channel FETs, while the switching transistor of switch 204 may be an n-channel FET.

Figure 4:
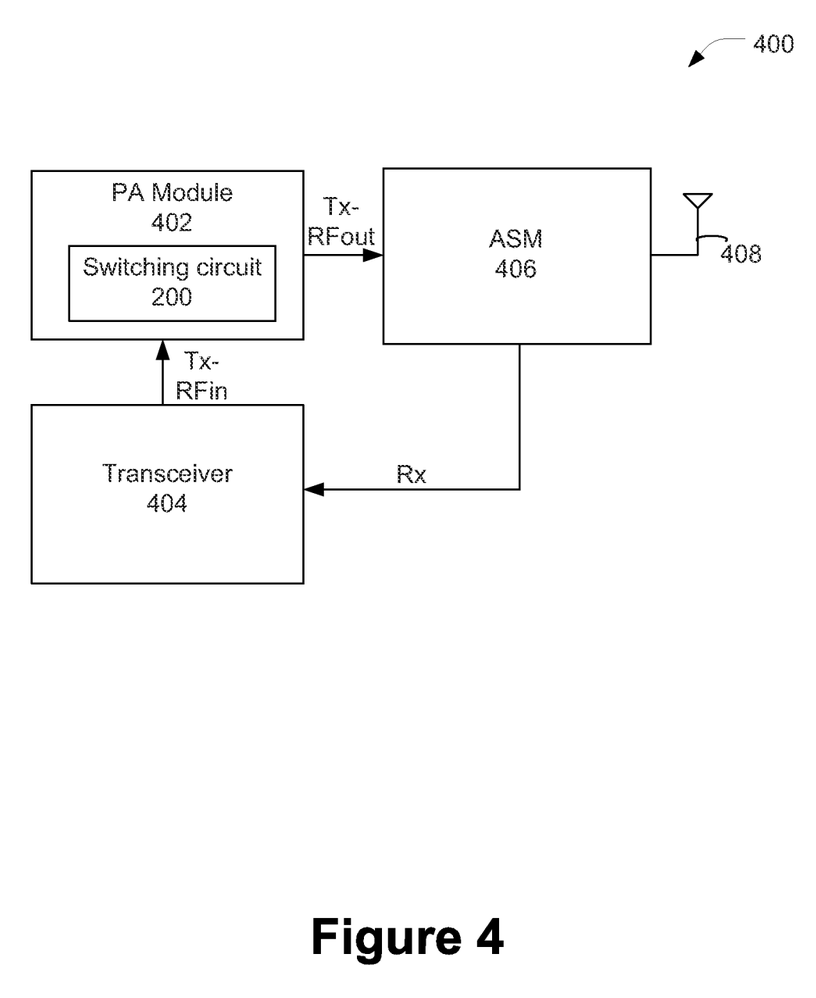
FIG. 4 is a block diagram of an exemplary wireless communication device, in accordance with various embodiments.

The switch 200 may be incorporated into a variety of systems. A block diagram of an example system 400 is illustrated in FIG. 4. As illustrated, the system 400 includes a power amplifier (PA) module 402, which may be a radio frequency (RF) PA module in some embodiments. The system 400 may include a transceiver 404 coupled with the PA module 402 as illustrated. The PA module 402 may include the switching circuit 200 to perform any of a variety of operations such as amplification, switching, mixing, etc. In various embodiments, the switching circuit 200 may additionally/alternatively be included in the transceiver 404 to provide, e.g., up-converting, or in an antenna switch module (ASM) 406 to provide various switching functions.

The PA module 402 may receive an RF input signal, RFin, from the transceiver 404. The PA module 402 may amplify the RF input signal, RFin, to provide the RF output signal, RFout. The RF input signal, RFin, and the RF output signal, RFout, may both be part of a transmit chain, respectively noted by Tx—RFin and Tx—RFout in FIG. 4.

The amplified RF output signal, RFout, may be provided to the ASM 406, which effectuates an over-the-air (OTA) transmission of the RF output signal, RFout, via an antenna structure 408. The ASM 406 may also receive RF signals via the antenna structure 408 and couple the received RF signals, Rx, to the transceiver 404 along a receive chain.

In various embodiments, the antenna structure 408 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 400 may be any system including power amplification. In various embodiments, inclusion of the switching circuit 200 in the system 400 to switch the RF signal may be particularly useful when the system 400 is used for power amplification at high RF power and frequency. For example, including the switching circuit 200 into the system 400 may be especially beneficial for transmission of Global System for Mobile Communication (GSM) signals with a power approximately 32 dBm or greater and a frequency of approximately 1800 megahertz (MHz) or higher, as well as lower band GSM signals, e.g., 800 MHz to 915 MHz, having a power of approximately 34 dBm or greater.

The system 400 may be suitable for any one or more of terrestrial and satellite communications, radar systems, and possibly in various industrial and medical applications. More specifically, in various embodiments, the system 400 may be a selected one of a radar device, a satellite communication device, a mobile computing device (e.g., a phone, a tablet, a laptop, etc.), a base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A switching circuit comprising:
    a first transistor having a first gate contact, a first drain contact, a first source contact, and a body contact;
    a second transistor having a second gate contact, a second drain contact coupled to the first gate contact, and a second source contact coupled to the body contact; and
    a first resistor and a second resistor coupled in series between the first drain contact and the first source contact, and wherein the second gate contact is coupled to the first resistor and the second resistor at a node between the first resistor and the second resistor.

2. The switching circuit of claim 1 wherein the first resistor and the second resistor are coupled by a control line.

3. The switching circuit of claim 1 wherein the first transistor is an N-channel field effect transistor and the second transistor is an N-channel field effect transistor.

4. The switching circuit of claim 1 wherein the first transistor is a P-channel field effect transistor and the second transistor is a P-channel field effect transistor.

5. The switching circuit of claim 1 wherein the first transistor is adapted to switch an RF signal of around 1800 MHz.

6. The switching circuit of claim 5 wherein the RF signal has a power that ranges between about 32 dBm and around 34 dBm.

7. A switching circuit comprising:
    a first switch comprising:
        a first transistor having a first gate contact, a first drain contact, a first source contact, and a first body contact;
        a second transistor having a second gate contact, a second drain contact coupled to the first gate contact, and a second source contact coupled to the first body contact;
    a second switch circuit comprising:
        a third transistor having a third gate contact, a third drain contact coupled to the first source, a third source contact, and a third body contact; and
        a fourth transistor having a fourth gate contact, a fourth drain contact coupled to the third gate contact, and a fourth source contact coupled to the third body contact; and
    a first resistor and a second resistor coupled in series between the first drain contact and the first source contact, and wherein the second gate contact is coupled to the first resistor and the second resistor at a node between the first resistor and the second resistor.

8. The switching circuit of claim 7 wherein the first resistor and the second resistor are coupled by a control line.

9. The switching circuit of claim 7 further including a third resistor and a fourth resistor coupled in series between the third drain contact and the third source contact, and wherein the third gate contact is coupled to the third resistor and the fourth resistor at a node between the third resistor and the fourth resistor.

10. The switching circuit of claim 9 wherein the third resistor and the fourth resistor are coupled by a control line.

11. The switching circuit of claim 7 wherein the first transistor is an N-channel field effect transistor and the second transistor is an N-channel field effect transistor.

12. The switching circuit of claim 7 wherein the first transistor is a P-channel field effect transistor and the second transistor is a P-channel field effect transistor.

13. The switching circuit of claim 7 wherein the third transistor is an N-channel field effect transistor and the fourth transistor is an N-channel field effect transistor.

14. The switching circuit of claim 7 wherein the third transistor is a P-channel field effect transistor and the fourth transistor is a P-channel field effect transistor.

15. The switching circuit of claim 7 wherein the gate contact of the first transistor and the gate contact of the third transistor are coupled together.

16. The switching circuit of claim 7 wherein the first transistor and the third transistor are adapted to switch an RF signal of around 1800 MHz.

17. The switching circuit of claim 16 wherein the RF signal has a power that ranges between about 32 dBm and around 34 dBm.

18. The switching circuit of claim 7 wherein the third source contact is coupled to a fixed voltage node.

* * * * *